(12) United States Patent
Neal et al.

(10) Patent No.: US 6,678,163 B1
(45) Date of Patent: Jan. 13, 2004

(54) HOUSING FOR SEMICONDUCTOR CHIPS

(75) Inventors: Howard Donald Neal, Chippenham (GB); Robert Charles Irons, Chippenham (GB)

(73) Assignee: Westcode Semiconductors Limited, Bristol (GB)

(*) Notice: Subject to any disclaimer, the term of this patent is extended or adjusted under 35 U.S.C. 154(b) by 0 days.

(21) Appl. No.: 10/326,733

(22) Filed: Dec. 19, 2002

(51) Int. Cl.[7] ............. H05K 7/18; H05K 7/12; H01L 23/04
(52) U.S. Cl. .......... 361/729; 361/728; 361/730; 361/731; 257/726; 257/727
(58) Field of Search .............. 361/716, 728–731, 361/733; 257/718–719, 720, 726, 727

(56) References Cited

U.S. PATENT DOCUMENTS

| | | | |
|---|---|---|---|
| 5,715,142 A | * 2/1998 | Jaeger et al. | 361/718 |
| 5,874,774 A | 2/1999 | Takahashi | 257/688 |
| 6,181,007 B1 | * 1/2001 | Yamazaki et al. | 257/718 |
| 6,303,974 B1 | * 10/2001 | Irons et al. | 257/584 |
| 6,538,308 B1 | * 3/2003 | Nakase et al. | 257/675 |

FOREIGN PATENT DOCUMENTS

| | | |
|---|---|---|
| EP | 0 637 080 | 2/1995 |
| EP | 0 645 816 | 3/1995 |
| EP | 0 746 023 | 12/1996 |
| EP | 0 923 127 | 6/1999 |
| EP | 0 962 973 | 12/1999 |

* cited by examiner

*Primary Examiner*—David Martin
*Assistant Examiner*—Dameon E. Levi
(74) *Attorney, Agent, or Firm*—Marshall, Gerstein & Borun LLP

(57) ABSTRACT

A housing arrangement for a plurality of semiconductor chips (1) is disclosed, in which each of the chips is received in a respective frame or cassette (4), there being a first electrically conductive member (5), having portions (6) which are in electrical connection with one face of each of the chips and a second electrically conductive member (7), having portions (8) which are in electrical connection with an opposite face of each of the chips.

5 Claims, 5 Drawing Sheets

HOUSING FOR SEMICONDUCTOR CHIPS

BACKGROUND OF THE INVENTION

The present invention relates to housing semiconductor chips.

In recent years, considerable interest has been shown in pressure contacted insulated gate bipolar transistor (IGBT) power devices. Since the size and therefore the power rating of an individual chip is quite low, this requires that the encapsulation consists of an array of such chips, in contrast to more traditional pressure contacted power devices which always use a single large chip.

A number of ways of achieving this are known. In one such example, the chips are held in a fixed array by a frame of plastics material. In another, a frame is stuck on to a chip and the chips butted together on a molybdenum disk.

While both of these solutions have been shown to work, consideration of the movement and forces within the encapsulation due to thermal expansion show the potential to generate stress and wear, which potential increases with the size (i.e. power) of the encapsulation.

In the first example above, this comes about because the chips try to move their positions relative to the centre of the encapsulation with the expansion coefficient of the frame material, while the contacting copper pole pieces expand with the expansion coefficient of copper.

In the second example, the chips are butted together and the outer chips move with the coefficient of expansion of silicon and the molybdenum disk with its expansion coefficient, while the copper and molybdenum also show relative movement.

In all these cases, the relative movement is proportional to the distance from the centre of the encapsulation. As the encapsulated device is made larger, the movement on the outer chips increases.

As particular pieces of prior art, there may be mentioned EP-A-0 962 973, EP-A-0 746 023, EP-A-0 645 816, EP-A-0 637 080 and U.S. Pat. No. 5, 874, 774.

SUMMARY OF THE INVENTION

According to a first aspect of the present invention, there is provided a housing arrangement for a plurality of semiconductor chips, in which each of said chips is received in a respective frame to form a discrete sub-assembly, there being a first electrically conductive member, having portions which are in electrical connection with one face of each of the chips, and a second electrically conductive member, having portions which are in electrical connection with an opposite face of each of the chips, a local axis of each of said chips and its respective connecting portions being free to move by thermal expansion relative to such a local axis of any other of said chips and its connecting portions, substantially without transferring stress between any of said chips.

In each of the frames there may be respective contact shims between said faces of the respective chip and the respective connecting portions.

The frames may be shaped so that, for each two adjacent frames, a projection on one side wall face of one of them enters into a recess of a side wall face of the other.

At least some of the frames may each be formed with a channel receiving a contact pin for an electrode (e.g. a control electrode) of the respective chip.

According to a second aspect of the present invention, there is provided a housing arrangement for a plurality of semiconductor chips, in which each of said chips is received in a respective frame to form a discrete sub-assembly, there being a first electrically conductive member, having portions which are in electrical connection with one face of each of the chips, and a second electrically conductive member, having portions which are in electrical connection with an opposite face of each of the chips, wherein each frame engages a clip which acts to retain components within the frame.

The clip may engage with protrusions formed on side wall faces of the frame.

The frames and clips may be shaped so that, for each two adjacent frames, a protrusion and engaging clip portion on one side wall face of one frame enters into a recess of a side wall face of the other frame.

BRIEF DESCRIPTION OF THE DRAWINGS

The present invention will now be described, by way of example, with reference to the accompanying drawings, in which.

DETAILED DESCRIPTION OF THE PREFERRED EMBODIMENTS

Figure 1:
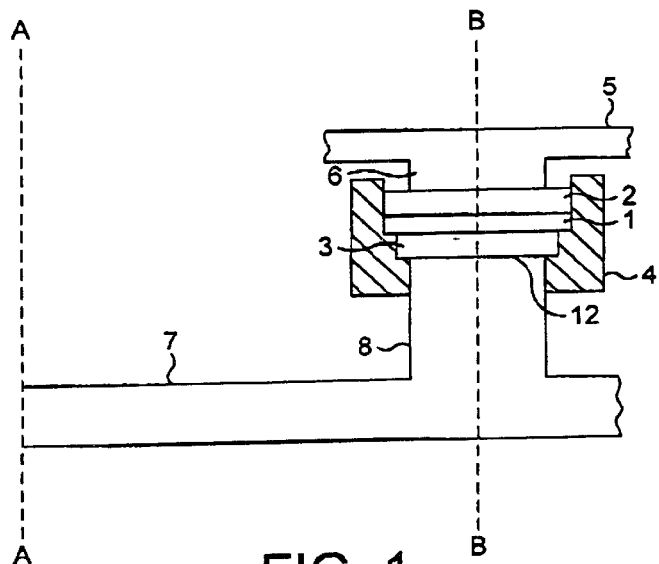
FIG. 1 is a section through part of an arrangement according to a first example of the invention.

In FIG. 1, reference numeral 1 designates one of a plurality of silicon chips each sandwiched between a respective pair of molybdenum shims 2 and 3 and received in a respective frame or cassette 4. Shim 2 is, by way of example, a collector contact shim, shim 3 being an emitter contact shim. Shim 12 is a silver shim forming a located floor in the frame 4. Each chip 1 and its shims 2, 3 and 12 and the respective frame or cassette 4 form a discrete sub-assembly, there being no solder connections in the sub-assembly.

Reference numeral 5 designates a copper member having portions 6 contacting all the shims 2 and reference numeral 7 designates a copper member having pillars 8 electrically contacting respective ones of the shims 3, to provide a housing for the various chips 1 in their frames 4. Accordingly, portions 6 are in electrical connection with collector faces of respective ones of chips 1, pillars 8 being in electrical connection with emitter faces of respective ones of chips 1.

A—A designates the centre line of the encapsulation, each arrangement 6, 2, 3, 4, 8, 12 having a respective local axis B—B.

As the portions 6 and pillars 8 are both copper, the local axis B—B will remain vertical even though its movement from the centre line A—A of the encapsulation may be large.

Whatever this movement however, it does not affect the relative movement of the silicon/molybdenum/copper sub-assembly whose relative movement is about the local axis B—B. This relative movement is:

a) small—because of the small chip size;
b) independent of distance from the centre line A—A;
c) identical for all the chips in the array.

Thus the local axis B—B of each chip 1 and its connecting portions 6 and 8 is free to move by thermal expansion relative to the local axis of any other of the chips and its connecting portions, substantially without transferring stress between any of the chips.

There could be, for example, thirty seven chips 1. In one such embodiment of this, all the chips could be IGBT chips with a current rating of approximately 3000 A for example. In a second such embodiment, there could be twenty-eight IGBT chips and nine diode chips, with a current rating of 2200 A for example. The overall housing arrangement could be about 100 mm diameter for example.

For clarity, FIG. 1 shows only one pillar 8 and its associated chip 1. In practice the pillars are as closely packed as possible while remaining sufficiently spaced so that stress cannot be transferred between chips.

Figure 2:
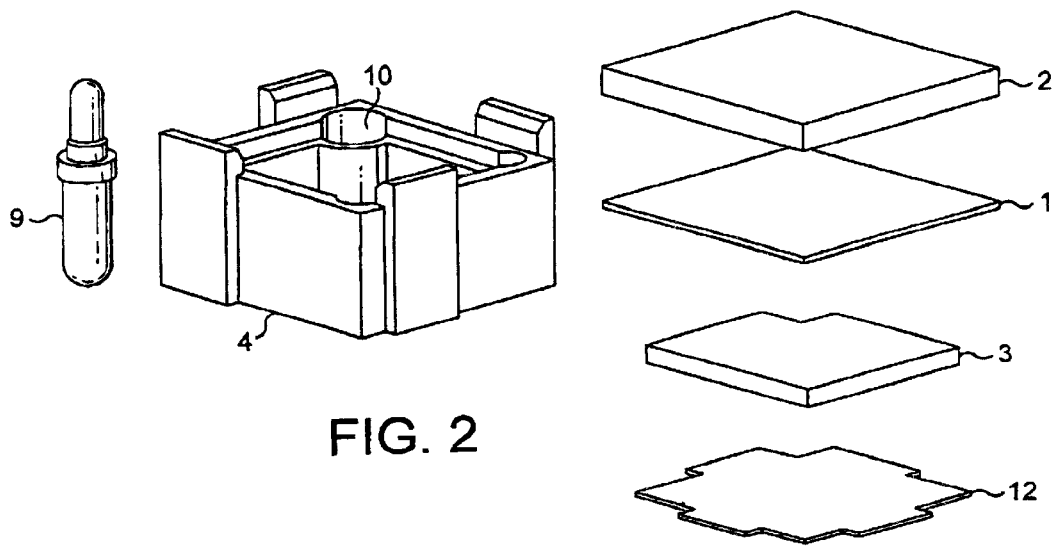
FIG. 2 is an exploded view of a frame/shims/chip sub-assembly for the first example of the invention.

Referring to FIG. 2, which is an exploded view of a frame/shims/chip sub-assembly for use as in FIG. 1, shims 2 and chip 1 are square and shims 3 and 12 are generally square but have cut-outs at one of each of their corners through which a gate contact pin 9 passes to contact the chip 1, the pin also passing through a respective insulated opening in copper member 7 to act as in EP-A-0 923 127 for example. Reference numeral 10 designates a passageway formed in frame 4 to receive pin 9.

A disadvantage of the system described above is the increased space occupied by the side walls of the frames 4 since the replacement of a single multi-chip locator preform by a plurality of single-chip locator frames 4 places two side walls between each chip location.

Figure 3:
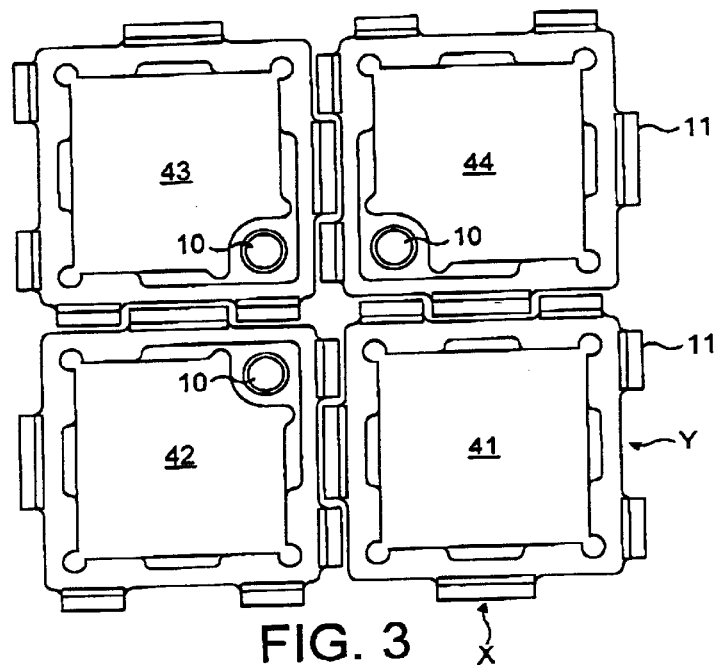
FIGS. 3 and 4 are a plan view and a perspective view of a group of frame structures according to a second example of the invention.
Figure 4:
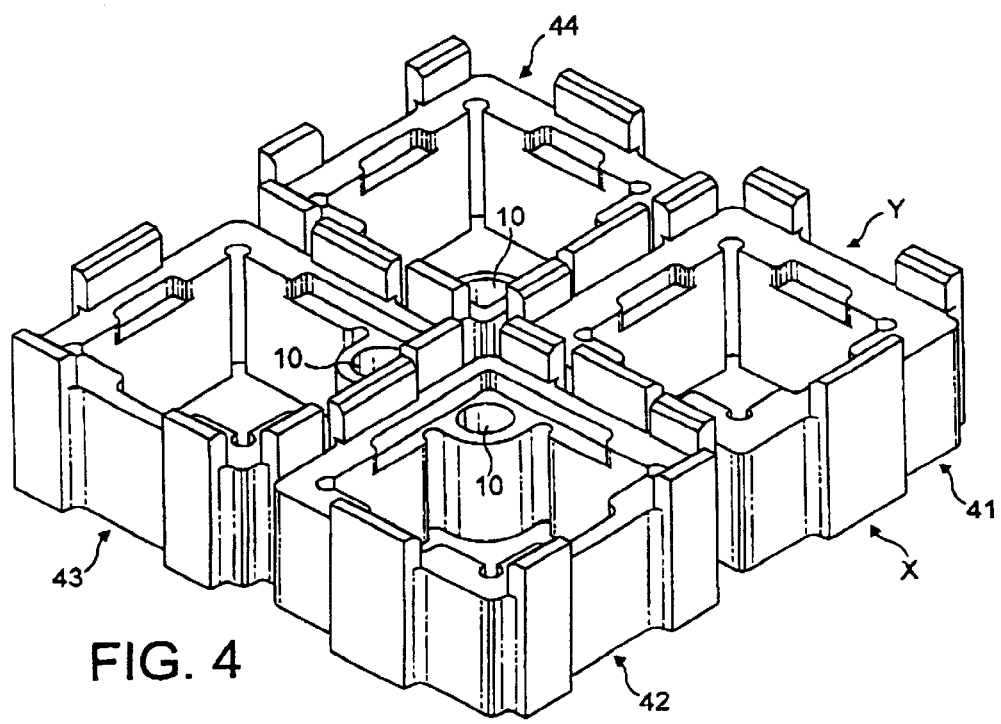
Figure 5:
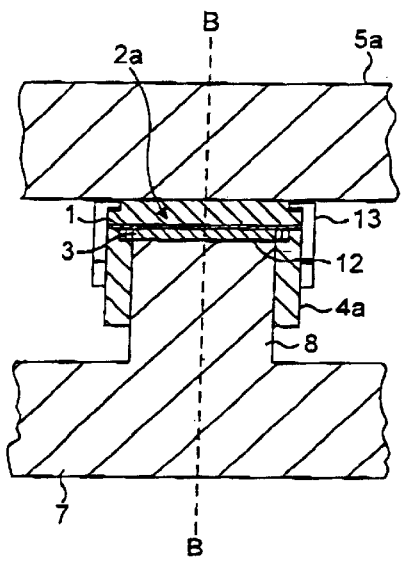
FIG. 5 is a section through part of an arrangement according to a third example of the invention.
Figure 6:
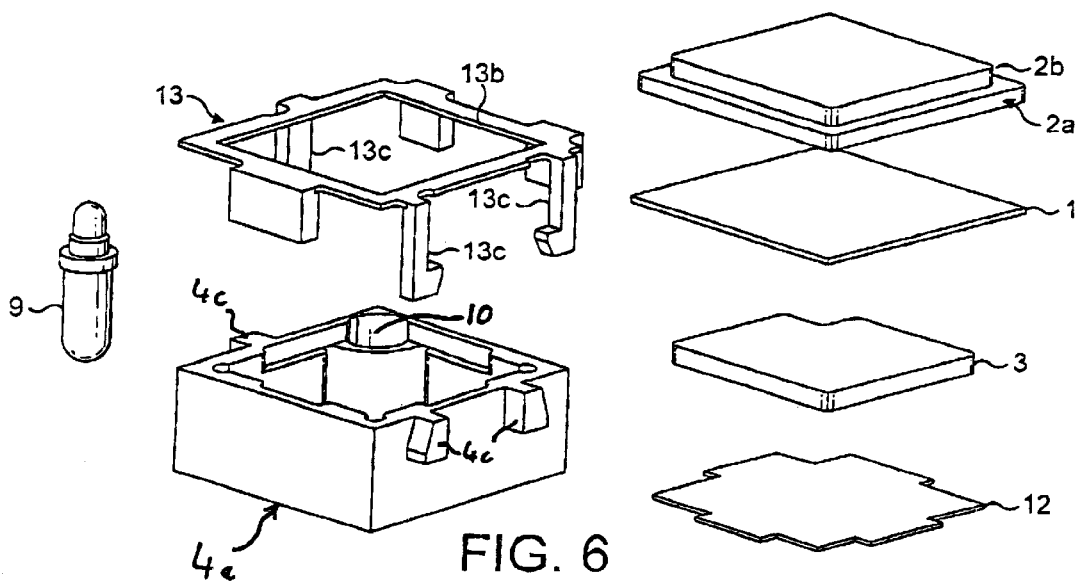
FIGS. 6 and 7 are exploded views of a frame/shims/chip sub-assembly for the third example of the invention.

In a further example of the invention, the frames 4, instead of being as shown in FIG. 2, are as illustrated in FIGS. 3 and 4. More particularly, the side walls of the frames 4 are made columnar in form so that they become discontinuous in horizontal section while still providing positive constraints to the positions of the captivated chips. The positions of the columns 11 are so arranged that adjacent frames 41, 42, 43 and 44 fit in a pattern with substantially only a single side wall thickness between each chip position. By defining two side wall types for any face of a rectangular frame, the types being denoted X (with a column 11 in the middle of each of two adjacent side wall faces) and Y (with a column 11 at each edge of each of the adjacent side wall faces) such that for any side wall face X its column 11 may enter into the space between columns 11 of any other side wall face Y, and by arranging the side wall faces in the rotational sequence X-X-Y-Y on each frame, a compact assembly of unlimited size can be achieved. Moreover, there is a choice of two methods of compact assembly. In the first, all rows and all columns of the assembly will face in one respective direction. In the second method, the respective directions of each row and each column will alternate.

In each case, for two adjacent frames, a projection on one side wall face of one of them (provided by a column 11 in the middle of the side wall face) enters into a recess of the other (provided between the columns 11 at opposite edges of the side wall face).

Each gate channel 10, occupied by a gate contact pin, may be in any corner of the particular frame 41, 42, 43 or 44 but only one style of IGBT frame is required. In the example, each channel is shown at the corner defined by a clockwise transition from an X face to a Y face. Some positions may be occupied by a diode chip instead of an IGBT chip, in which case a different frame 41, 42, 43 or 44, without a channel, is provided, but the wall arrangement remains identical, this being shown in FIGS. 3 and 4, in which frames 42, 43 and 44 each has a gate channel 10 but frame 41 does not.

A specific advantage of this alternative style of assembly is that the gate pin channels 10 arrange themselves in groups of up to four at abutting corners. This has the desirable effect of simplifying the means of gate signal distribution within the assembly.

A further example is shown in FIGS. 5 to 9. Here one of a plurality of chips 1 is sandwiched between shims 2*a* and 3, with silver shim 12 positioned between shim 3 and pillar 8. Copper member 7 and pillar 8 are substantially unchanged from the previous examples. Shim 2*a* is a modified form of shim to include a recessed step 2*b*, which accommodates the body 13*b* of a clip 13. Engaging portions 13*c* of the clip 13 depend from the body 13*b*, and engage with protrusions 4*c* on side wall faces of frame 4*a*. Frame 4*a* may also include at one corner a gate channel 10 to receive a gate contact pin 9. Shims 3 and 12 each include a cut-out at one corner to accommodate the gate contact pin 9.

In this example, the electrical components (i.e. chip 1 and shims 2*a*, 3 and 12) are positioned inside the frame 4*a* and retained in place by clip 13. The clip is attached to frame 4*a* by pressing it down onto the frame until the engaging portions 13*c* snap into locking engagement with protrusions 4*c*. The engaging portions 13*c* can pass over the chip 1 without applying any force to the chip, and the clip does not increase the horizontal cross-section of the assembly. Because the clip body 13*b* is received in recess 2*b*, the top of the body is below the top of shim 2*a* so that the assembly maintains its horizontal profile. This allows a top conductor 5*a* to be used which has a flat contact surface, i.e. with no projecting contact portions.

Figure 7:
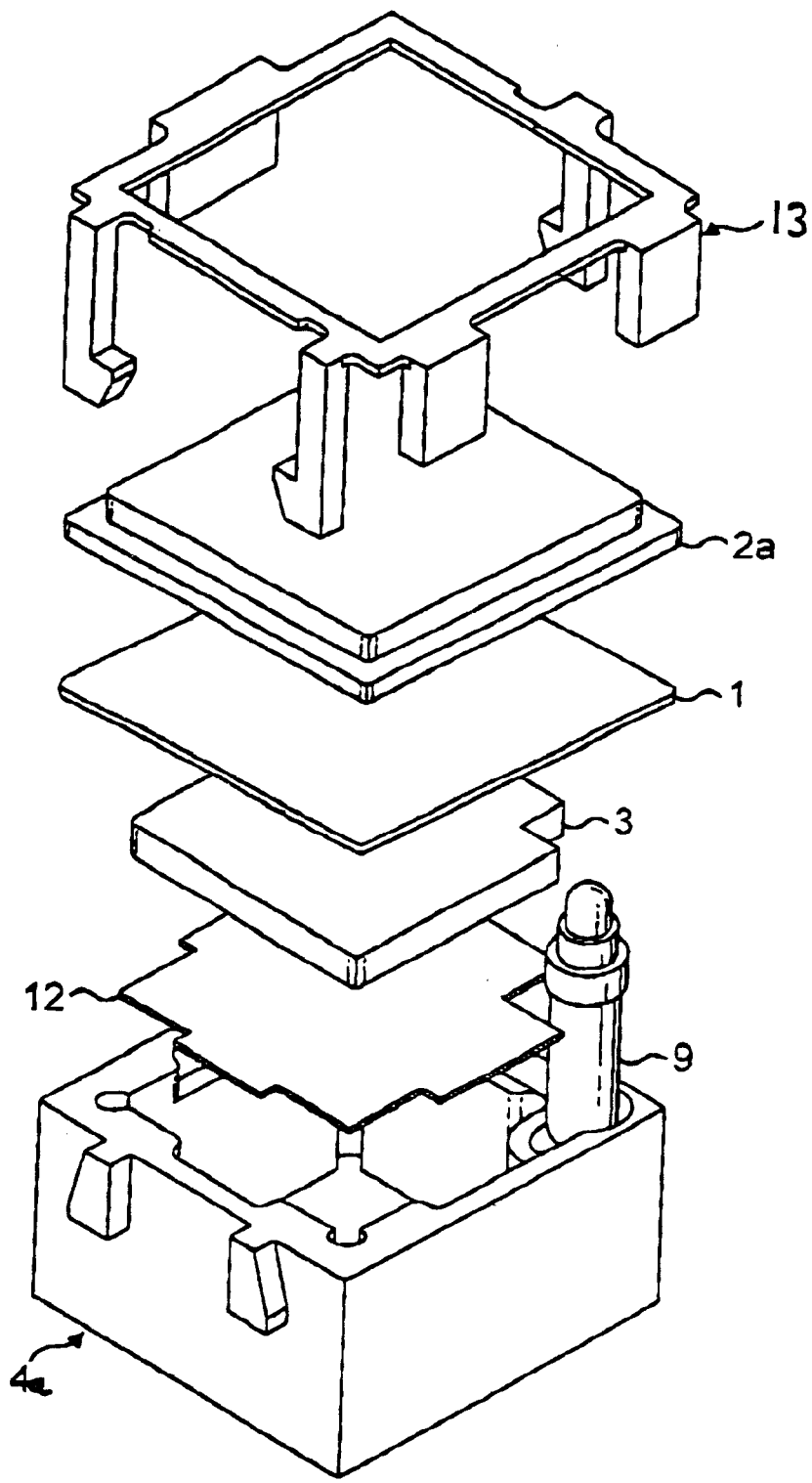
Figure 8:
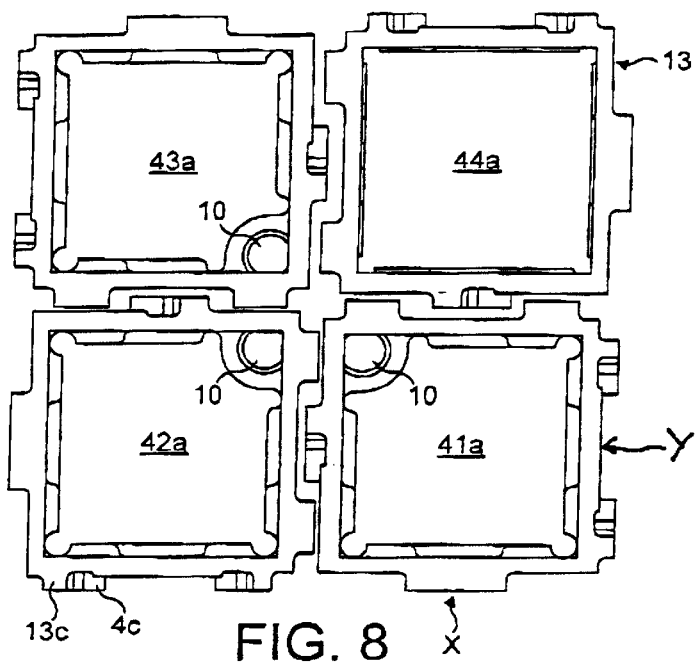
FIGS. 8 and 9 are a plan view and a perspective view of a group of frame structures according to the third example of the invention.
Figure 9:
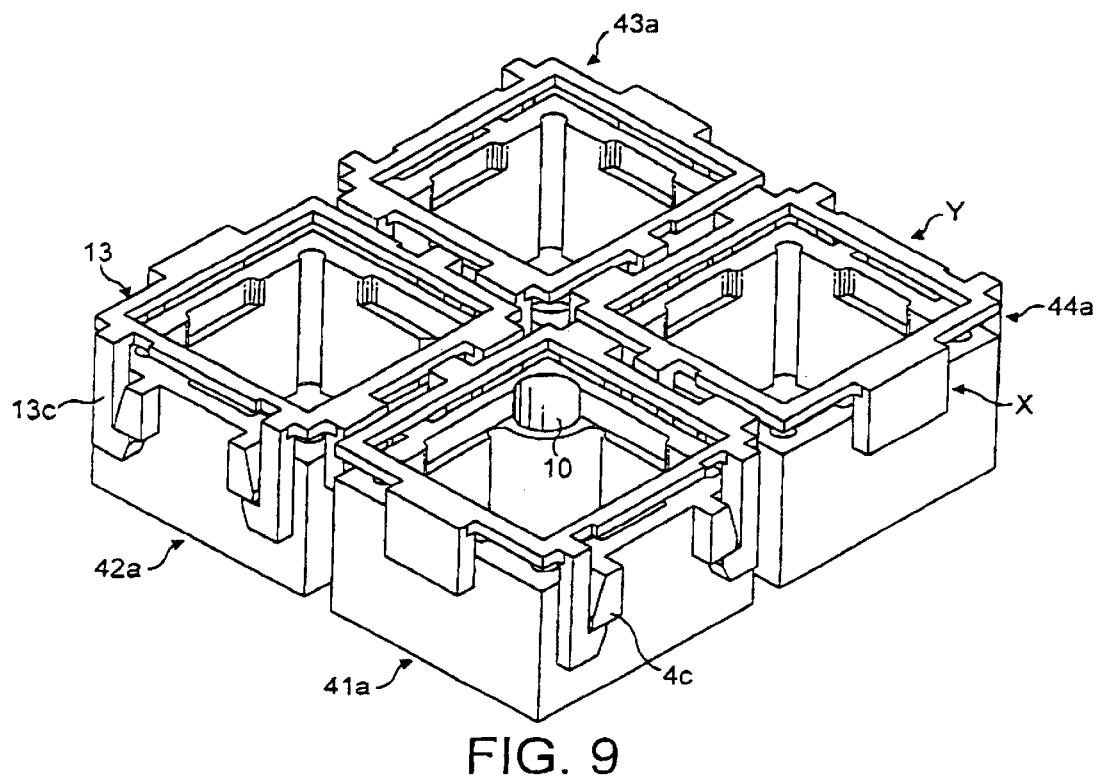

As shown more clearly in FIGS. 7, 8 and 9, the clip 13 has depending portions which, in combination with protrusions 4*c*, provide each side wall face of the frame assembly with a projecting portion and a recess portion. This enables each frame to tessellate with its surrounding frames in a similar fashion to the second example, in which a projecting portion of a side wall face of one frame is received by a recess portion of a side wall face of an adjacent frame. A side wall type X comprises a central projecting portion with a recess portion on each side, while type Y comprises two projecting portions with a central recess portion. This arrangement allows the chip frames to be closely packed while still permitting relative movement between frames so that stress is not transferred between chips. FIGS. 8 and 9 show four adjacent frames 41*a*, 42*a*, 43*a* and 44*a* where frames 41*a*, 42*a* and 43*a* each have a gate channel 10 at abutting corners, but frame 44*a* does not. As in the second example, this simplifies the means of gate signal distribution within the assembly.

This example has the advantage that a flat top conductor 5*a* can be used which simplifies construction and reduces cost. Furthermore each single chip housing can be functionally tested and if found to be defective can easily be opened to replace the chip 1.

In the examples of the invention, rather than a single locating frame to take all the chips, each has its own individual frame. An individual sub-assembly for each chip allows for a reduction in the number of component interfaces and a simplification of the pre-testing of chips prior to final package assembly—i.e. if a chip fails, replacement of it is more straightforward.

Although in the examples described shims 2, 2*a* and 3 are formed from molybdenum, copper or other metals may alternatively be used.

What is claimed is:

1. A housing arrangement for a plurality of semiconductor chips, in which each of said chips is received in a respective frame to form a discrete sub-assembly, there being a first electrically conductive member, having portions which are in electrical connection with one face of each of the chips, and a second electrically conductive member, having portions which are in electrical connection with an opposite face of each of the chips, a local axis of each of said chips and its respective connecting portions being free to move by thermal expansion relative to such a local axis of any other of said chips and its connecting portions, substantially without transferring stress between any of said chips, and wherein the frames are shaped so that, for each two adjacent frames, a projection on one side wall face of one of them enters into a recess of a side wall face of the other.

2. An arrangement according to claim 1, wherein in each of the frames there are respective contact shims between said faces of the respective chip and the respective connecting portions.

3. An arrangement according to claim 1, wherein at least some of the frames are each formed with a channel receiving a contact pin for an electrode of the respective chip.

4. A housing arrangement for a plurality of semiconductor chips, in which each of said chips is received in a respective frame to form a discrete sub-assembly, there being a first electrically conductive member, having portions which are in electrical connection with one face of each of the chips, and a second electrically conductive member, having portions which are in electrical connection with an opposite face of each of the chips, wherein each frame engages a clip, the clip acting to retain components within its associated frame, and portions of each clip engage with protrusions formed on side wall faces of its associated frame, and wherein the frames and clips are shaped so that, for each two adjacent frames, a protrusion and engaging clip portion on one side wall face of one frame enters into a recess of a side wall face of the other frame.

5. An arrangement according to claim 4, wherein at least some of the frames are each formed with a channel receiving a contact pin for the respective chip.

* * * * *